(12) United States Patent
Ji

(10) Patent No.: US 11,655,553 B2
(45) Date of Patent: May 23, 2023

(54) PROCESSING DEVICE BASED ON ELECTROCHEMISTRY AND PROCESSING METHOD USING SAME

(71) Applicant: YUANZHI TECHNOLOGY (SHANGHAI) CO., LTD., Shanghai (CN)

(72) Inventor: Pengkai Ji, Shanghai (CN)

(73) Assignee: YUANZHI TECHNOLOGY (SHANGHAI) CO., LTD., Shanghai (CN)

( * ) Notice: Subject to any disclaimer, the term of this patent is extended or adjusted under 35 U.S.C. 154(b) by 277 days.

(21) Appl. No.: 17/098,302

(22) Filed: Nov. 13, 2020

(65) Prior Publication Data

US 2021/0147992 A1 May 20, 2021

(30) Foreign Application Priority Data

Nov. 15, 2019 (CN) .......................... 201911119575.4

(51) Int. Cl.
| | |
|---|---|
| *C25D 1/00* | (2006.01) |
| *B33Y 80/00* | (2015.01) |
| *B33Y 30/00* | (2015.01) |
| *B33Y 70/10* | (2020.01) |
| *B33Y 10/00* | (2015.01) |
| *H01L 27/144* | (2006.01) |

(52) U.S. Cl.
CPC .............. *C25D 1/003* (2013.01); *B33Y 10/00* (2014.12); *B33Y 30/00* (2014.12); *B33Y 70/10* (2020.01); *B33Y 80/00* (2014.12); *H01L 27/1443* (2013.01); *H01L 27/1446* (2013.01)

(58) Field of Classification Search
None
See application file for complete search history.

(56) References Cited

U.S. PATENT DOCUMENTS

2016/0222538 A1* 8/2016 Pascall .................. C25D 13/22

FOREIGN PATENT DOCUMENTS

| CN | 104088066 A | 10/2014 | |
|---|---|---|---|
| CN | 106077852 A | 11/2016 | |
| WO | WO-2020190808 A1 * | 9/2020 | ......... G06F 12/0806 |

* cited by examiner

*Primary Examiner* — Louis J Rufo

(57) ABSTRACT

A processing device based on electrochemistry includes a platform, a power supply and at least one modeling mechanism which is arranged under the platform and movable with respect to the platform. The modeling mechanism includes a photoelectric wheel, a light source and a container in which an ionic liquid is stored. The photoelectric wheel is rotatable and partially immersed in the ionic liquid. The photoelectric wheel includes a transparent conductive layer and a photoconductive layer bound together from inside to outside. The transparent conductive layer is electrically connected to an electrode of the power supply, and the platform is electrically connected to the other electrode of the power supply. The light source is arranged inside the photoelectric wheel and emits a light beam to pass through the transparent conductive layer towards the platform to selectively irradiate the photoconductive layer.

20 Claims, 10 Drawing Sheets

PROCESSING DEVICE BASED ON ELECTROCHEMISTRY AND PROCESSING METHOD USING SAME

CROSS-REFERENCE TO RELATED APPLICATIONS

This application claims the benefit of priority from Chinese Patent Application No. 201911119575.4, filed on Nov. 15, 2019. The content of the aforementioned application, including any intervening amendments thereto, is incorporated herein by reference in its entirety.

TECHNICAL FIELD

The present application relates to electrodeposition and electroetching, and more particularly to a processing device based on electrochemistry and a processing method using the same.

BACKGROUND

The existing electrochemical deposition, micro-electroforming and electrolysis generally involve relatively complex process and high cost and lack flexibility and precision. For example, during the electroforming, the anode is usually customized for different models, so it takes a lot of time and money to manufacture some models. During through-mask electrolysis which is considered as a typical electrolytic machining, the anode needs to be applied with glue, exposed to light, developed, etc., which are time-consuming, laborious and costly. Similarly, an anode mask pattern is customized for different processing patterns. Likewise, a pattern mask as cathode is also required to be customized in the electrochemical pattern transfer process, which has poor flexibility.

The electrodeposition or the electroetching is a technique in which a closed cavity generally needs to be fabricated, so that the electrolyte can be rapidly pumped out of the closed cavity to allow for the replenishment. However, these existing techniques have complicated process and consume a large amount of electrolyte, in addition, they are not suitable for modeling a multilayered three-dimensional structure. Furthermore, electrolytic machining is performed using a programmable electrode array, which cannot guarantee the machining accuracy, affects the molding speed in the condition that the electrical conductivity is limited, and lacks the sensitivity in controlling on-off of the current.

In the conventional selective electrodeposition, the electrolyte like the ionic liquid and ionic solution is sprayed via a nozzle and a metal model is built up in successive layers by electrodeposition in an energized condition. However, these processes are still complicated, and the device used herein has a complex structure. In addition, only one nozzle is used, or the array electrodes are limited in number, causing slow printing and low accuracy. Moreover, during the electrodeposition, the electrolyte covers a surface of the model to give rise to the electrodeposition thereon, which lowers the molding accuracy.

SUMMARY

The present application aims to provide a processing device based on electrochemistry and a processing method using the same, by which selective electrodeposition additive manufacturing or selective electrolytic etching becomes flexible and precise, so the accuracy, efficiency and control sensitivity of electrochemical deposition additive manufacturing or electrolytic etching are comprehensively improved, thereby reducing costs and facilitating the manufacture of three-dimensional models with complex structure and large size.

The technical solutions of the present application are described as follows.

In a first aspect, the present application provides a processing device based on electrochemistry, comprising:
a platform which is electrically conductive;
a power supply;
a light source;
a container configured to store an ionic liquid; and
at least one modeling mechanism;
wherein the at least one modeling mechanism is arranged facing the platform; and the at least one modeling mechanism and the platform are movable with respect to each other;
the at least one modeling mechanism comprises a photoelectric wheel which is rotatable; and an outer surface of the photoelectric wheel is able to be applied with the ionic liquid from the container;
wherein the photoelectric wheel comprises a transparent conductive layer and a photoconductive layer bound together from inside to outside; the transparent conductive layer is electrically connected to an electrode of the power supply; and the platform is electrically connected to the other electrode of the power supply; and
a light beam emitted by the light source passes through the transparent conductive layer towards the platform to selectively irradiate the photoconductive layer.

In an embodiment, the photoconductive layer is formed from a photoconductive material.

In an embodiment, the photoconductive layer has a PN junction consisting of an N-type semiconductor layer and a P-type semiconductor layer bound together;
in the case of electrodeposition, the P-type semiconductor layer is arranged on an outer side of the N-type semiconductor layer; and in the case of electroetching, the N-type semiconductor layer is arranged on an outer side of the P-type semiconductor layer.

In an embodiment, the photoconductive layer has a PNP-type phototransistor array;
in the case of electrodeposition, the photoconductive layer comprises an N-type semiconductor layer and a P-type semiconductor layer bound together from inside to outside; the N-type semiconductor layer is provided with a discrete P-type semiconductor array which is electrically connected to the transparent conductive layer; and the transparent conductive layer is electrically connected to a positive electrode of the power supply; and
in the case of electroetching, the photoconductive layer comprises the N-type semiconductor layer and the P-type semiconductor layer bound together from outside to inside; the N-type semiconductor layer is provided with the discrete P-type semiconductor array; the P-type semiconductor layer is electrically connected to the transparent conductive layer; and the transparent conductive layer is electrically connected to a negative electrode of the power supply.

In an embodiment, the photoconductive layer has an NPN-type phototransistor array;
in the case of electrodeposition, the photoconductive layer comprises an N-type semiconductor layer and a P-type semiconductor layer bound together from inside to outside; the P-type semiconductor layer is provided with a discrete N-type semiconductor array; the N-type semiconductor layer is electrically connected to the transparent conductive layer; and the transparent conductive layer is electrically connected to a positive electrode of the power supply; and in the case of electroetching, the photoconductive layer comprises the P-type semiconductor layer and the N-type semiconductor layer bound together from inside to outside; the P-type semiconductor layer is provided with the discrete N-type semiconductor array which is electrically connected to the transparent conductive layer; and the transparent conductive layer is electrically connected to a negative electrode of the power supply.

In an embodiment, in the case of electrodeposition, the transparent conductive layer is electrically connected to a positive electrode of the power supply; the platform is electrically connected to a negative electrode of the power supply; and in the case of electroetching, the transparent conductive layer is electrically connected to the negative electrode of the power supply; and the platform is electrically connected to the positive electrode of the power supply.

In an embodiment, the modeling mechanism and the platform are movable with respect to each other in a horizontal direction;

wherein the modeling mechanism and the platform perform linear translation with respect to each other in the horizontal direction, or the modeling mechanism and the platform are rotatable with respect to each other in the horizontal direction around an axis.

In an embodiment, the modeling mechanism and the platform are movable with respect to each other in a vertical direction.

In an embodiment, the at least one modeling mechanism is arranged under the platform, and the at least one modeling mechanism further comprises the container in which the ionic liquid is stored; and the photoelectric wheel is rotatably arranged in the container and partially immersed in the ionic liquid.

In an embodiment, the photoelectric wheel is of a hollow cylindrical structure, and the photoelectric wheel and the platform perform linear translation with respect to each other.

In an embodiment, the photoelectric wheel is of a conveyor belt structure and is supported by at least two rollers.

In an embodiment, the photoelectric wheel is a hollow truncated cone; and the platform and the photoelectric wheel are rotatable with respect to each other around an axis.

In an embodiment, a detachable plate is electrically conductive and provided on a side of the platform facing the photoelectric wheel.

In an embodiment, a scraper is provided in the container and submerged in the ionic liquid; the scraper and the outer surface of the photoelectric wheel are in sliding fit or in clearance fit;

a cavity of the container is divided by the scraper into a first region and a second region; an ionic liquid with a low ionic concentration is arranged in the first region; an ionic liquid with a high ionic concentration is arranged in the second region; in the case of electrodeposition, the first region is connected to an ion replenisher via an ion liquid return line, and the second region is connected to the ion replenisher via an ionic liquid supply line; and in the case of electroetching, the second region is connected to an ion dilution device via the ion liquid return line, and the first region is connected to the ion dilution device via the ionic liquid supply line.

In a second aspect, the present application provides a processing device based on electrochemistry, comprising:

a platform which is electrically conductive;

a light source;

a container configured to store an ionic liquid; and at least one modeling mechanism;

wherein the at least one modeling mechanism is arranged facing the platform; and the at least one modeling mechanism and the platform are movable with respect to each other;

the at least one modeling mechanism comprises a photoelectric wheel which is rotatable; an outer surface of the photoelectric wheel is able to be applied with the ionic liquid from the container;

wherein the photoelectric wheel comprises a transparent conductive layer and a photoconductive layer bound together from inside to outside; the transparent conductive layer is electrically connected to the platform; the photoconductive layer comprises a P-type semiconductor layer and an N-type semiconductor layer; when the P-type semiconductor layer and the ionic liquid are electrically connected, the N-type semiconductor layer is electrically connected to the transparent conductive layer; and when the N-type semiconductor layer and the ionic liquid are electrically connected, the P-type semiconductor layer is electrically connected to the transparent conductive layer; and a light beam emitted by the light source passes through the transparent conductive layer towards the platform to selectively irradiate the photoconductive layer.

In a third aspect, the present application provides a processing method based on electrochemistry using the processing device of claim 1, the processing method comprising:

1) activating the photoelectric wheel to rotate; and forming an ionic liquid layer attached on the outer surface of the photoelectric wheel;

2) adjusting a distance between the platform and the photoelectric wheel to a preset value, so that the platform is in contact with the ionic liquid layer;

3) according to a structure of a model to be deposited or etched, controlling the light beam emitted by the light source to pass through the transparent conductive layer to selectively irradiate the photoconductive layer; forming a preset electrode pattern on the photoelectric wheel; and forming a localized electric field in the ionic liquid layer between the photoelectric wheel and the platform;

4) when the transparent conductive layer is electrically connected to a positive electrode of the power supply, and the platform is electrically connected to a negative electrode of the power supply, performing electrodeposition on a position of the platform corresponding to the localized electric field; when the transparent conductive layer is electrically connected to the negative electrode of the power supply, and the platform is electrically connected to the positive electrode of the power supply, performing etching on a position of the platform corresponding to the localized electric field; and 5) controlling the platform and the photoelectric wheel to move relatively in a horizontal direction; and forming, by electrodeposition, a model with a preset shape on the platform, or forming, by electrolysis, an etching groove with a preset shape on the platform.

In an embodiment, the model is built in a layer-by-layer manner during electrodeposition; steps 2)-5) are repeated to deposit respective layers of the model to be deposited in sequence, so as to obtain the model; when a layer of the model is formed on the platform, in step 2), a distance between the model and the photoelectric wheel is adjusted to a preset value, so that the model is in contact with the ionic liquid layer, and is separated from the photoelectric wheel.

In an embodiment, during electrodeposition or electroetching, respective layers of the model are detected to obtain their surface flatness or the etching groove is detected to obtain a depth pattern of the etching groove, and current is increased or decreased at respective points of the respective layers of the model to flatten the respective layers of the model or level the etching groove.

In an embodiment, in step 3), a light intensity of the light beam of respective points of respective layers of the model is adjusted so as to increase or decrease their current.

In an embodiment, a plurality of modeling mechanisms are provided to electrodeposit heterogeneous materials.

The present application has the following beneficial effects.

1) In the present application, the photoelectric wheel is selectively exposed to light, so the exposed area becomes electrically conductive. Shape changeable electrode patterns can be obtained on the photoelectric wheel and shape changeable localized electric field can be formed in the ionic liquid layer, thereby rendering the selective electrodeposition additive manufacturing or the selective electrolytic etching flexible and precise. In addition, the on-off of the current is easily and rapidly controlled by the control to the light beam, which greatly benefits the accuracy, efficiency and control sensitivity of the electrochemical deposition additive manufacturing or electrolytic etching.

2) In the present application, the platform or the model is only in contact with the ionic liquid layer that is thin and on the photoelectric wheel. The platform or the model becomes conductive when the photoelectric wheel is selectively exposed to the light. However, rest parts of the platform or the model are not in contact with the ionic liquid. Such structure can effectively avoid electrodeposition in non-target areas of the platform and avoid the repetitive occurrences of electrodeposition in an area of the model where the printing has been completed, thereby greatly improving the accuracy of the model or the etching groove.

3) In the present application, the photoelectric wheel continuously rotates around its own axis to realize continuous replenishment of the ionic liquid in the localized electric field, which benefits the efficiency of electrodeposition and electroetching. The device has a simple structure, and the processing can proceed even there is a small amount of the ionic liquid, which helps to reduce the production costs and the equipment size. In addition, the photoelectric wheel and the platform are movable with respect to each other, which helps to build models with a large size.

4) There may be a plurality of modeling mechanisms in the present application. By their cooperation, the modeling proceeds faster, and not only the model with the complicated structure but also the model formed from different materials can be processed, which effectively widens the application range of the present disclose.

DETAILED DESCRIPTION OF EMBODIMENTS

The present application will be further described below with reference to the embodiments. It should be understood that these embodiments are merely illustrative, but are not intended to limit the scope of the present application. In addition, any modifications or placements made by those skilled in the art based on the spirit of the present disclosure should fall within the scope as defined by the appended claims.

Figure 1:
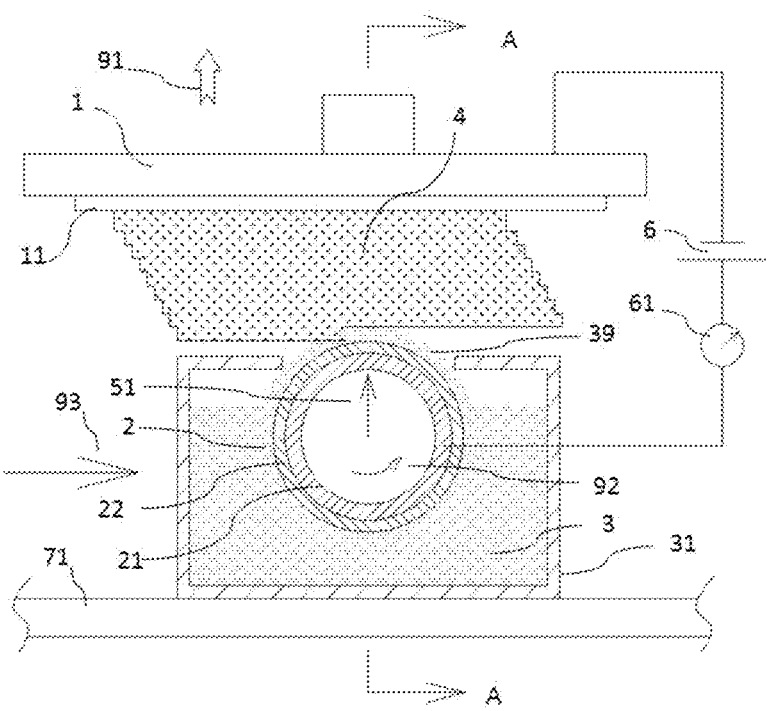
FIG. 1 is a schematic diagram of a processing device in which electrodeposition is performed.
Figure 2:
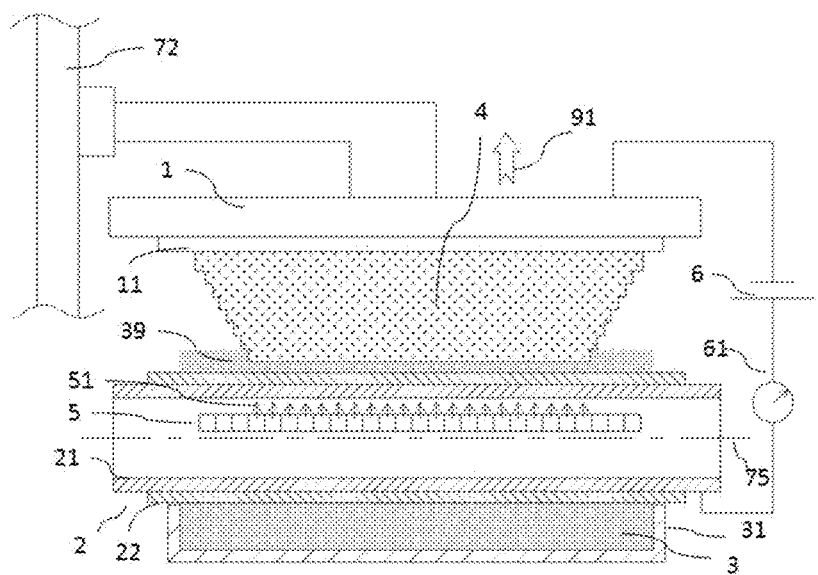
FIG. 2 is a sectional view of the processing device in which electrodeposition is performed taken along A-A of a photoelectric wheel of the processing device of FIG. 1.
Figure 13:
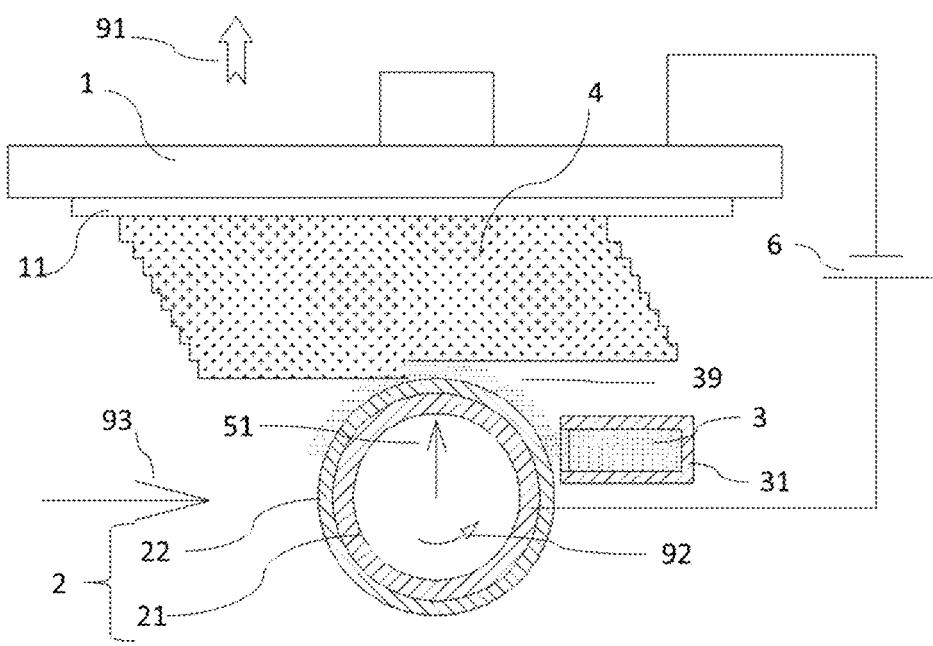
FIG. 13 is a schematic diagram of the processing device in which electrodeposition is performed according to an embodiment of the present application.

As shown in FIGS. 1, 2 and 13, an electrodeposition processing device based on electrochemistry includes a platform 1, a power supply 6 and a modeling mechanism. The modeling mechanism includes a photoelectric wheel 2. The modeling mechanism may include a container 31 configured to store an ionic liquid 3, so that there is always enough ionic liquid 3 for use. The container may include an enclosure for storing the ionic liquid 3. The modeling mechanism may include a light source 5. The modeling mechanism is arranged facing the platform. Specifically, in some embodiments, the modeling mechanism shown in FIGS. 1-2 and 13-16 is arranged under the platform. In some embodiments, the modeling mechanism shown in FIGS. 13-16 is arranged above the platform. The modeling mechanism and the platform are movable with respect to each other. The photoelectric wheel 2 includes a transparent conductive layer 21 and a photoconductive layer 22 attached to an outer side of the transparent conductive layer 21. The transparent conductive layer 21 is electrically conductive, and through which a light beam or electromagnetic waves can pass. When the photoconductive layer 22 is exposed to the light beam, the exposed area becomes conductive or has the low resistance, and it is not conductive or high resistance when no light bean is exposed.

The outer surface of the photoelectric wheel 2 is applied with the ionic liquid from the container 31 by several approaches. In the first approach, the photoelectric wheel 2 is partially immersed in the ionic liquid 3 which is stored in the container 31 shown in FIGS. 1 and 2. In the second approach, the ionic liquid 3 spreads toward the photoelectric wheel 2 from the container shown in FIG. 13. The photoelectric wheel 2 is rotatable around an axis 75 along a direction shown as a first arrow 92 or along its opposite direction, in other words, the photoelectric wheel 2 rotates around its own axis. The platform 1 and the photoelectric wheel 2 (or the modeling mechanism) can move with respect to each other. In some embodiments, the container 31 may not move, but only the photoelectric wheel 2 moves along a first guide rail 71. In an embodiment, as shown in FIGS. 1-2 and 13-16, the modeling mechanism includes the photoelectric wheel 2 and the container 31. The container 31 is configured to store the ionic liquid, so that there is always enough ionic liquid 3 for use. The modeling mechanism may be movable along a direction shown as a second arrow 93, that is, along a first guide rail 71 shown in FIG. 1. The container 31 moving with the photoelectric wheel 2 is conducive to forming the stability of the ionic liquid layer 39, reducing a volume of the ionic liquid 3 and a size of the container 31 and facilitating the replenishment of the ionic liquid during processing.

A model 4 is attached to the platform 1, and may move along a direction shown as a third arrow 91, that is, along a second guide 72 vertically arranged. In some embodiments, the platform 1 can further be provided with a detachable plate 11, and the model 4 is attached to the detachable plate 11, such that the model 4 is easily removed from the platform 1 by removing detachable plate 11 after electrodeposition molding is completed. The platform 1 and the detachable plate 11 are both conductive.

A negative electrode of the power supply 6 is electrically connected to the platform 1, and a positive electrode of the power supply 6 is electrically connected to the transparent conductive layer 21. In some embodiments, the platform 1 is not conductive, but the detachable board 11 is conductive, and the negative electrode of the power supply 6 is electrically connected to the detachable plate 11. In an embodiment, the platform 1 is electrically conductive, and the detachable plate 11 is regarded as a part of the platform 1. The platform 1 may be made from composite materials. In an embodiment, only a surface of the platform 1 that contacts the model 4 is conductive, and rest parts thereof are not conductive. The electrical connection between the power supply 6 and the platform 1 may refer to the electrical connection between the power supply 6 and a surface of the platform 1 that contacts the model 4.

The power supply 6 can be a direct-current (DC) power supply, a pulse power supply or a power supply with an adjustable output voltage or current (such as a digital power supply). A switch is optionally provided in an electrical circuit of the device. A current detector 61 is optionally provided in the electrical circuit to detect the current during the electrodeposition, so as to control the lighting and the movement of the device.

For the purpose of the convenience, the second guide rail 72 is not shown in FIG. 1, and the first guide rail 71 is not shown in FIG. 2.

During the electrodeposition, the photoelectric wheel 2 rotates around the axis 75, so that the ionic liquid 3 is attached to a surface of the photoelectric wheel 2 and then reaches an area between the photoelectric wheel 2 and the platform 1 to form an ionic liquid layer 39. The platform 1 is positioned along the second guide rail 72 such that the platform 1 or the model 4 on the platform 1 contacts the ionic liquid layer 39, but does not contact the photoelectric wheel 2.

According to predetermined layer patterns of the model and a position of the photoelectric wheel 2 along the first guide rail 71, the light beam 51 emitted by the light source 5 irradiates to form patterns. The light beam 51 passes through the transparent conductive layer 21 toward the platform 1 to selectively irradiate the photoconductive layer 22, such that a part of the photoconductive layer 22 exposed to the light beam is conductive, and the electrical circuit is formed by the transparent conductive layer 21 and the ionic liquid layer 39, the model 4, the platform 1 and the power supply 6, whereby the localized electric field is formed in the ionic liquid layer 39, and ions in the ionic liquid layer 39 move to the model 4 to perform electrodeposition, thereby forming at least one electrodeposited layer.

At the same time, due to the rotation of the photoelectric wheel 2, more ionic liquid 3 arrives between the photoelectric wheel 2 and the model 4, so that more ions are replenished for the electrodeposition. As the photoelectric wheel 2 moves along the first guide rail 71, the light beam 51 is dynamically adjusted to selectively irradiate the photoconductive layer 22 according to the predetermined patterns and the position of the photoelectric wheel 2 relative to the first guide rail 71, and thus conductive patterns on the photoelectric conductive layer 22 are dynamically adjusted, thereby depositing the ions in the ionic liquid 3 on the platform 1 or the model 4 according to the predetermined patterns.

After an electrodeposited layer is obtained, the electrodeposition is completed or continuously performed by moving the platform 1 a predetermined distance away from the photoelectric wheel 2 along the second guide rail 72 and operating the photoelectric wheel 2 to obtain the next electrodeposited layer by the selective electrodeposition. These processes are repeated until the model 4 in whole is formed.

An example of light source 5 is schematically shown in FIG. 2 according to an embodiment. The light source 5 may be a LED array light source, a LCD light source, a DLP light source or a laser scanning light source. A position of the light source 5 as shown in FIG. 2 is merely for illustration. In an embodiment, the light source 5 is arranged in the modeling mechanism and can move with the modeling mechanism. In an embodiment, the light source 5 is not arranged in the modeling mechanism and cannot move with the modeling mechanism. In an embodiment, the light beam of the light source 5 may be transmitted to the modeling mechanism through optical fibers (not shown in the figures).

It should be noted that, in an embodiment, the modeling mechanism moves along an opposite direction of the third arrow 91, and the platform 1 does not move along the third arrow 91. In an embodiment, the platform 1 moves along the third arrow 91, and the modeling mechanism does not move along the third arrow 91.

The first guide rail 71 and the second guide rail 72 as shown in FIGS. 1-2 are only for the illustration. In an embodiment, the ionic liquid 3 is a metal salt solution or an electrolyte which are formed from metals (e.g., copper, nickel and ion) or alloys. In an embodiment, the ionic liquid 3 may be a copper sulfate solution, a Nickel sulfate solution (i.e., the Watt solution), an ion chloride solution, a fluoroborate solution, a sodium nitrate solution, a sodium chloride solution or a sulfamate solution.

Figure 8:
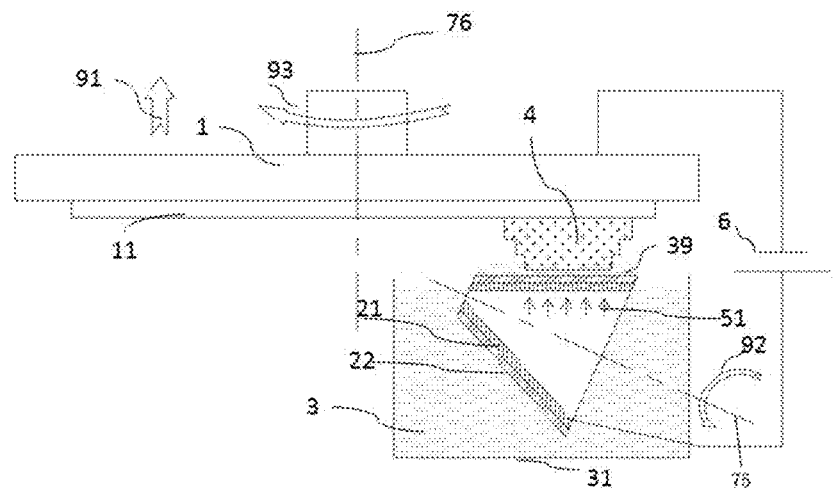
FIG. 8 is a schematic diagram of the processing device in which electrodeposition is performed according to an embodiment of the present application.
Figure 9:
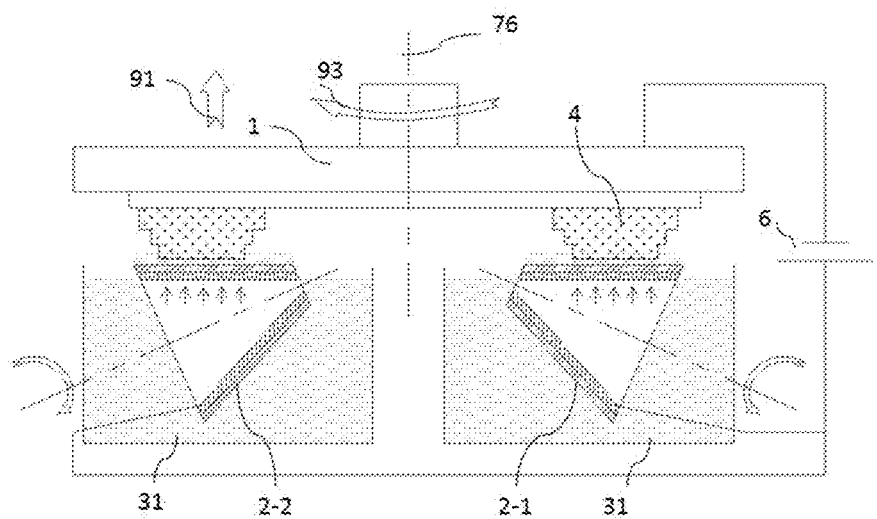
FIG. 9 is a schematic diagram of the processing device in which electrodeposition is performed according to an embodiment of the present application.

In an embodiment, the relative movement of the platform 1 and the photoelectric wheel 2 (or the modeling mechanism) refers to a relative vertical movement, specifically, the platform 1 drives the model 4 to move away from the photoelectric wheel 2 a predetermined distance in the direction shown as the third arrow 91, or the platform 1 and the model 4 do not move but the photoelectric wheel 2 moves in the opposite direction of the third arrow 91. In an embodiment, the relative movement of the platform 1 and the photoelectric wheel 2 (or the modeling mechanism) refers to a relative horizontal movement, for example, the platform 1 moves relative to the photoelectric wheel 2 in the direction of the second arrow 93, or the photoelectric wheel 2 moves relative to the platform 1 in the direction of the second arrow 93. The relative horizontal movement can be a relative linear translation as shown in FIGS. 1-2 or a relative horizontal rotation around the axis 76 as shown in FIGS. 8-9, Through the relative vertical movement between the platform 1 and the photoelectric wheel 2, a lower surface of the model 4 is in contact with the ionic liquid layer 39 and does not contact with the photoelectric wheel 2. Or, a distance between the lower surface of the model 4 and the photoelectric wheel 2 maintains within a set value range, thereby improving the molding accuracy of the electrodeposition.

The term "horizontal" refers to a direction that may be parallel to the surface of the platform 1 which contacts the model 4, and the term "vertical" refers to a direction that may be perpendicular to the surface of the platform 1 which contacts the model 4.

The photoelectric wheel 2 is rotatably arranged on the container 31. In an embodiment, a bearing (not shown in the figures) is arranged between the photoelectric wheel 2 and the container 31 to facilitate the rotation of the photoelectric wheel 2, and the bearing is not described herein in detail. Electroetching can be performed by swapping positions of electrodes of the power supply 6 as shown in FIGS. 1-2.

In an embodiment, the photoconductive layer 22 is made of a photoconductive material including an organic photoconductive material (such as photoconductive polymers, specifically like polyvinyl carbazole) and an inorganic photoconductive material. In an embodiment, the photoconductive layer 22 is a micro-nano array formed from the photoelectric materials. The photoconductive material has the changeable resistivity due to the photoconductive effect. In an embodiment, the photoconductive layer 22 is made of semiconductor materials that can form PN junctions, for example, by doping silicon materials, or made of materials that can form heterojunction. These materials exposed to light can generate electrodynamic force and make circuit conductive due to photovoltaic effect, thereby forming electric current. In an embodiment, the transparent conductive layer 21 is made from some common transparent and conductive materials, such as indium tin oxide and aluminum-doped zinc oxide.

In general, the present application has the following beneficial effects.

The photoelectric wheel 2 is selectively exposed to light, so the exposed area becomes electrically conductive. Shape changeable electrode pattern can be obtained on the photoelectric wheel 2 and shape changeable localized electric field can be formed in the ionic liquid layer 39, thereby rendering the selective electrodeposition additive manufacturing or the selective electrolytic etching flexible and precise. In addition, the on-off of the current is easily and rapidly controlled by the control to the light beam 51, which greatly benefits the accuracy, efficiency and control sensitivity of the electrochemical deposition additive manufacturing or electrolytic etching.

The platform 1 or the model 4 is only in contact with the ionic liquid layer 39 that is thin and on the photoelectric wheel 2, and the platform 1 or the model 4 becomes conductive when the photoelectric wheel 2 is selectively exposed to the light. And, rest parts of the platform 1 or the model 4 is not in contact with the ionic liquid 3. Such structure can effectively avoid electrodeposition in non-target areas of the platform 1 and avoid the repetitive occurrences of electrodeposition in an area of the model 4 that the printing has been completed, thereby greatly improving the forming accuracy of the model 4.

The photoelectric wheel 2 continuously rotates around its own axis to realize continuous replenishment of the ionic liquid 3 in the localized electric field, which helps to improve the efficiency of electrodeposition and electroetching. In addition, the photoelectric wheel 2 and the platform 1 are movable with respect to each other in a horizontal direction, which helps to build models with a large size. Further, the device has a simple structure, and the processing can proceed even there is a small amount of the ionic liquid, which helps to reduce the production costs, the equipment size and the leakage of the ionic liquid 3, thereby allowing the device to operate under a favored environment, facilitating the simultaneous operation of multiple modeling mechanisms for electrodeposition and realizing electrodeposition of the heterogeneous material.

Embodiment 1

Figure 3:
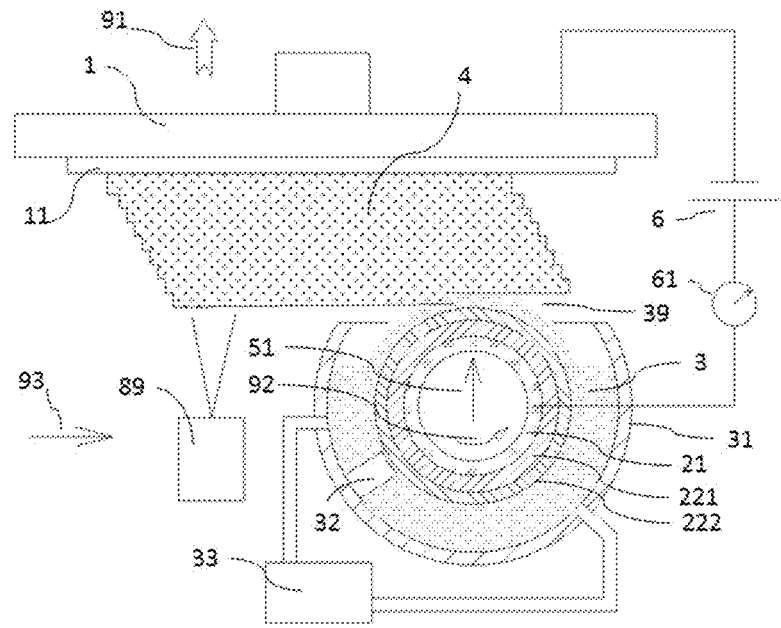
FIG. 3 is a schematic diagram of the processing device in which electrodeposition is performed according to an embodiment of the present application.

FIG. 3 illustrates a photoconductive layer 22 having a PN junction. The photoconductive layer 22 includes an N-type semiconductor layer 221 and a P-type semiconductor layer 222 bound together from inside to outside 221. The P-type semiconductor layer 222 and the ionic liquid 3 are electrically connected, for example, in a manner that the P-type semiconductor layer 222 contacts the ionic liquid 3. In an embodiment, a conductive protective layer is provided on a surface of the P-type semiconductor layer 222, and then the conductive protective layer contacts the ionic liquid 3 to realize electrical connection. Of course, the conductive protective layer is preferably arranged in an array to prevent current diffusion in the conductive protective layer, so as to ensure the accuracy of the electrochemical machining. The P-type semiconductor layer 222 may be in discrete array pattern. According to the photovoltaic effect of the PN junction, a position exposed to the light beam 51 generates voltage or current, so the PN junction is conductive to form a conductive loop. An electrode pattern is formed on a surface of the photoelectric wheel 2 according to the pattern of the light beam 51. At the same time, due to the photovoltaic effect, an area exposed to the light beam 51 functions as a photovoltaic cell, which can be considered as a solar panel. In such case, the power supply 6 can be removed, and be replaced with a wire. The irradiated area generates electricity due to photovoltaic effect, so the electrodeposition can be performed without the power supply. Therefore, localized electrodeposition can be carried out in the area where photovoltaic power generates by the control of the light beam 51. The photoelectric wheel 2 is selectively conductive by selective illumination to form the localized electric field therein, so that the selective electrodeposition additive manufacturing becomes more flexible and accurate, and there is no need to customize template or mask according to different processing requirements, which is beneficial to shortening the processing cycle and reducing the processing cost. In addition, the electrochemical process can be driven without additional power supply, i.e., only illumination is needed, whereby electricity can be generated, and the localized electric field is formed. Therefore, the device and the processing method used herein are simplified, and the device is convenient to use and involves reduced cost. The photoconductive layer 22 can be considered as a highly integrated photodiode array attached to the photoelectric wheel 2. The on-off control of the current has a faster response due to photovoltaic effect, as opposed to the photoconductivity effect. For example, the response time by photovoltaic effect can be microseconds or even hundreds of nanoseconds. The light beam 51 can be controlled to rapidly irradiate or stop the irradiation, and the irradiation intensity of the light beam can also be rapidly changed, such that current or voltage is dynamically adjusted at a high frequency, so as to form square wave current or sine wave current and the like, thereby facilitating the characteristics or efficiency of different electrodeposition or electrolytic etching, and widening the application range. The term "bound" means that two layers of materials closely fit with each other or may penetrate each other.

The container 31 as shown in FIG. 3 is cylindrical with a circular cross section perpendicular to its axis, so that a volume of the container 31 can be reduced. In addition, ion liquid 3 required herein is less when the photoelectric wheel 2 is immersed in the ion liquid 3 at the same depth, which facilitates the replenishment and replacement of the ion liquid and avoids the useless corner. A scraper 32 may be fixedly provided on an inner side of the container 31, for example, at a position farthest from the platform 1. The scraper 32 and the photoelectric wheel 2 are in sliding fit or in slight clearance fit.

A cavity of the container is divided, by the scraper 32, into a first region and a second region. During the rotation of the photoelectric wheel 2 along the first arrow 92, an ionic liquid with a low ionic concentration is arranged in the first region arranged above the scraper 32 or a left side of the scraper 32, as shown in FIG. 3. And an ionic liquid with a high ionic concentration is arranged in the second region arranged below the scraper 32 or a right side of the scraper 32, as shown in FIG. 3. The position of the ionic liquid with the low ionic concentration and the position of the ionic liquid with the high ionic concentration may swap if the photoelectric wheel 2 rotates in an opposite direction of the first arrow 92. During the electrochemistry, the ionic liquid with the low ionic concentration is separated from the ionic liquid with the high ionic concentration. The ionic liquid with the low ionic concentration can be introduced into an ion replenisher 33 via an ion liquid return line, and then flows into the second region via an ionic liquid supply line from the ion replenisher 33. Such arrangement is conducive to uniform ion distribution and preferred ion concentration during the formation of the ionic liquid layer 39 under the rotation of the photoelectric wheel 2.

It should be noted that the photoconductive layer 22 may have a PIN photodiode, and a transition layer I is formed between the P-type semiconductor layer 222 and the N-type semiconductor layer 221, that is, the PN junction has a larger width in the intrinsic region, so as to realize higher photovoltaic conversion sensitivity. In addition, the P-type semiconductor layer 222 and the N-type semiconductor layer 221 can use materials including monocrystalline silicon, polycrystalline silicon, amorphous silicon, CdTe, CIGS, GaAs, dye-sensitized materials, organic thin films and compounds, or can use MS junctions or heterojunctions including heterojunctions with the same type (e.g., P-P type heterojunctions or N-N type heterojunctions) and heterojunctions with different types (e.g., P-N type heterojunctions). It can be understood that PN junctions are formed in different ways in the present invention. A cascaded PN junction can also be formed, for example, wide band gap PN junctions (such as GaInP) can be located above the narrow band gap PN junctions (such as GaAs) in the heterojunction structure to form the cascaded PN junction. A cascade photovoltaic panel formed by stacking a plurality of photovoltaic PN junctions is beneficial to improving the photoelectric conversion efficiency, and can improve the electrodeposition current and speed under the same illumination. Of course, other semiconductor junctions can also be used as PN junctions to realize photovoltaic effect. The use of the PN junction can improve the response speed of the photoconductive layer 22. An area becomes conductive rapidly when being exposed to the light beam 51 and becomes insulative rapidly when the irradiation stops, so that the photoelectric wheel 2 can rotate with higher speed, thereby improving the replacement speed of ionic liquid and the speed and accuracy of the electrodeposition molding.

Embodiment 2

Figure 4:
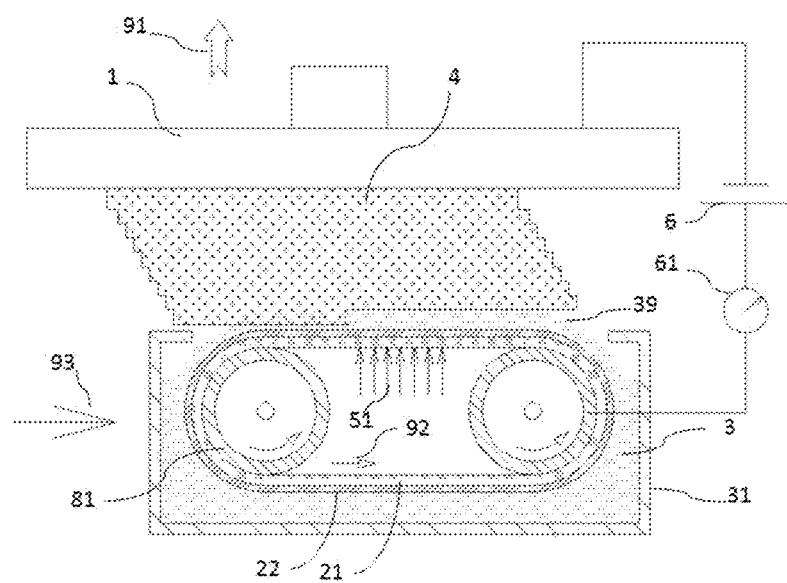
FIG. 4 is a schematic diagram of the processing device in which electrodeposition is performed according to an embodiment of the present application.
Figure 14:
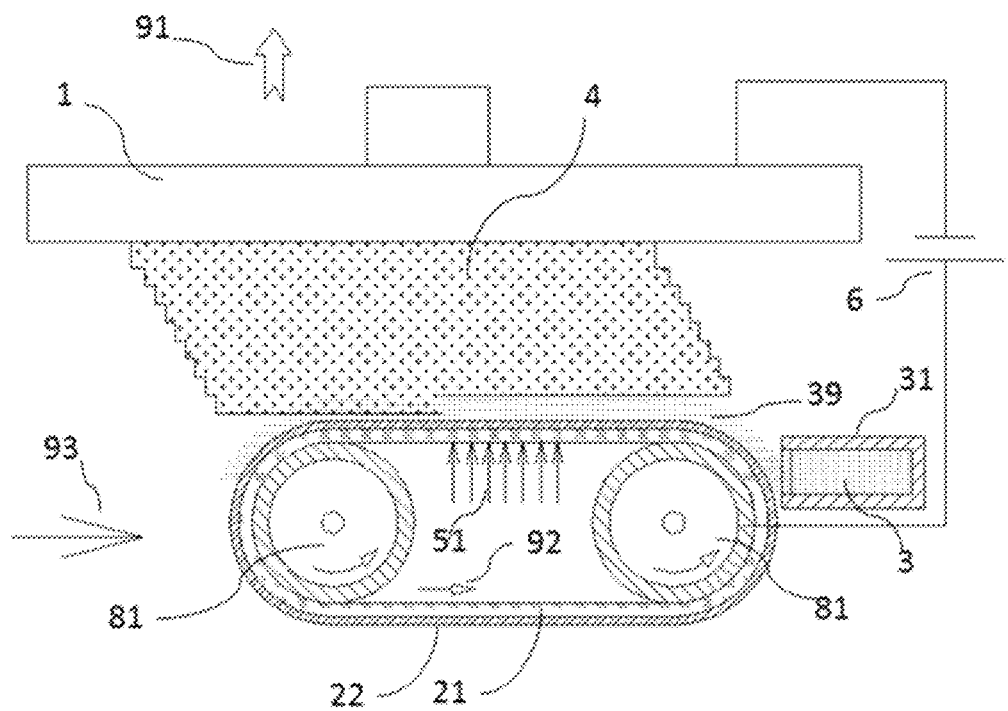
FIG. 14 is a schematic diagram of the processing device in which electrodeposition is performed according to an embodiment of the present application.
Figure 15:
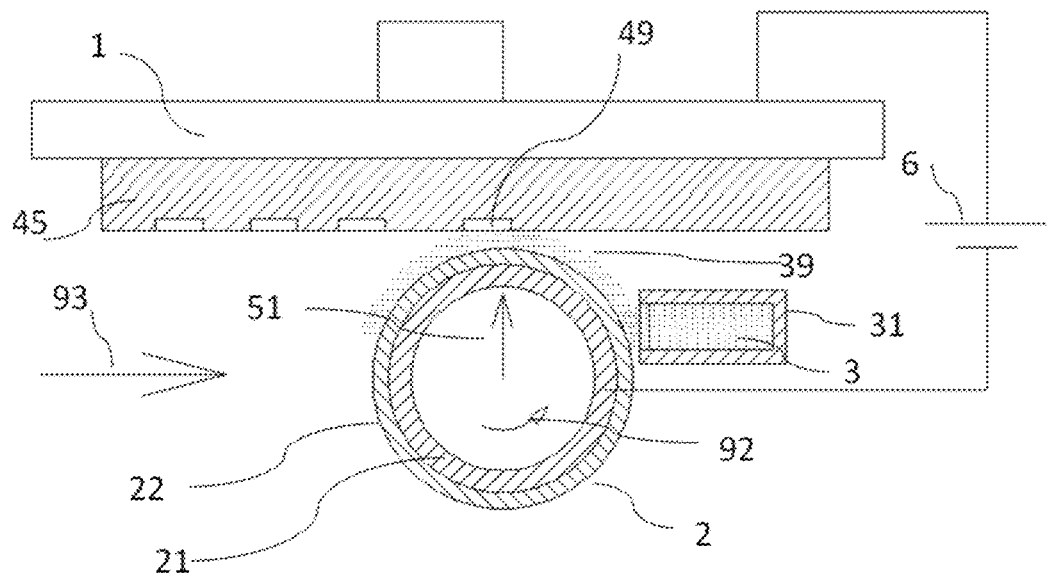
FIG. 15 is a schematic diagram of the processing device in which electroetching is performed according to an embodiment of the present application.
Figure 16:
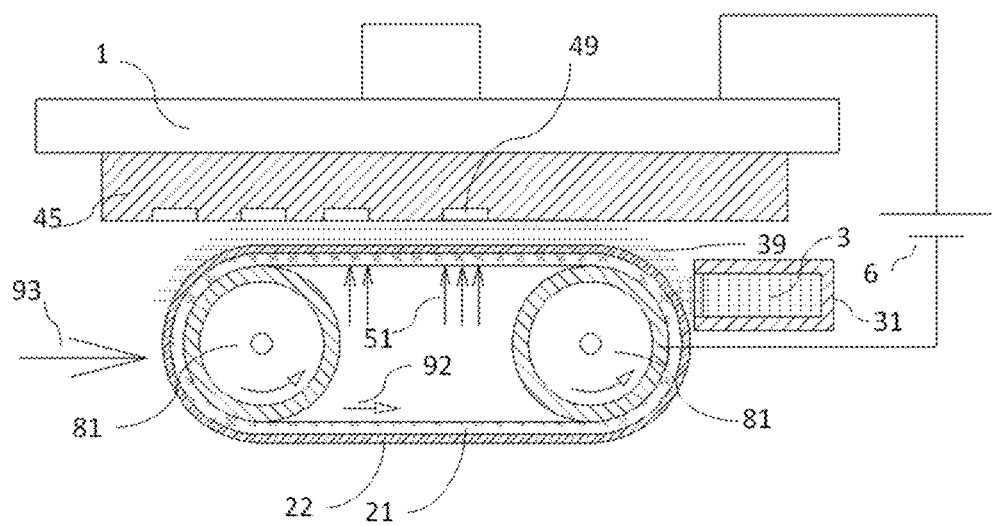
FIG. 16 is a schematic diagram of the processing device in which electroetching is performed according to an embodiment of the present application.

FIGS. 4 and 14 illustrate that a photoelectric wheel 2 is of a conveyor belt structure that is circularly rotatable. The photoelectric wheel 2 includes the transparent conductive layer 21 and the photoconductive layer 22. The photoelectric wheel 2 may be made of elastic materials and supported by at least two rollers 81 to form a conveyor belt-like structure. Of course, the photoelectric wheel 2 may have an opening by disconnecting the conveyor belt. One end of the photoelectric wheel 2 is wound on one roller 81 and the other end of the photoelectric wheel 2 is wound on another roller 81, and the photoelectric wheel 2 is supported by at least two rollers 81 to form a conveyor belt-like structure. The rollers 81 rotate in the same direction to drive the photoelectric wheel 2 to rotate along the first arrow 92, or the two rollers 81 may rotate simultaneously in a reciprocating manner, so that a part of the photoelectric wheel 2 between the two rollers 81 has a flat surface, thus, more light beams 51 can irradiate the photoconductive layer 22, which forms an electrode pattern with a larger area, enlarges the localized electric field, thereby improving the electrodeposition molding speed. In addition, there is more space to arrange the light source or allow for the beam transmission. By swapping positions of electrodes of the power supply 6, the electrolytic etching can proceed, and a speed of the electrode etching can also be improved.

Embodiment 3

Figure 5:
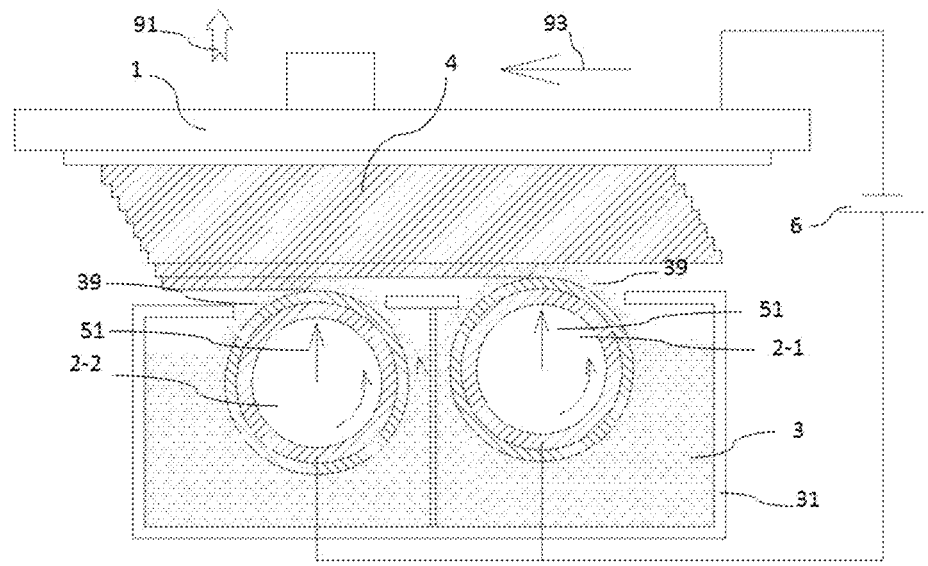
FIG. 5 is a schematic diagram of the processing device in which electrodeposition is performed according to an embodiment of the present application.
Figure 6:
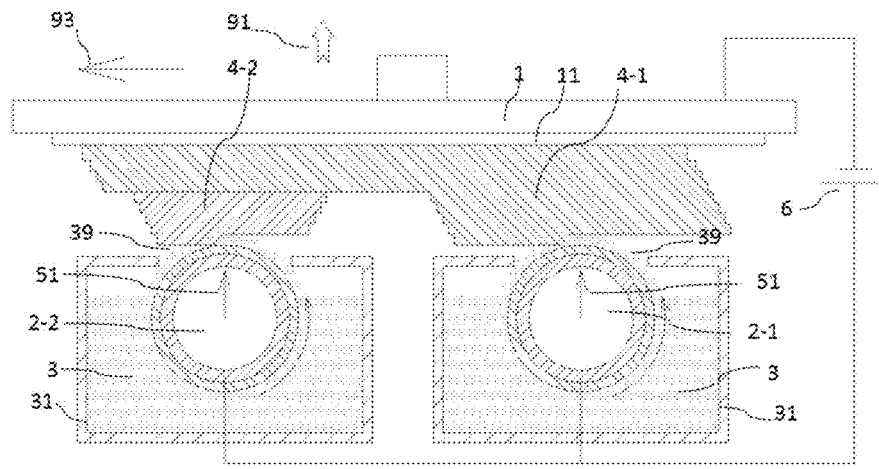
FIG. 6 is a schematic diagram of the processing device in which electrodeposition is performed according to an embodiment of the present application.

FIGS. 5 and 6 illustrate a plurality of photoelectric wheels 2, which can simultaneously perform electrodeposition, whereby, the electrodeposition proceeds faster, and composite materials can be electrodeposited. FIG. 5 shows a photoelectric wheel 2-1 and a photoelectric wheel 2-2. The photoelectric wheel 2-1 electrodeposits a layer A, and the photoelectric wheel 2-2 electrodeposits the next layer on the layer A, so that two layers are deposited and thus the modeling speed of the electrodeposition is increased.

FIG. 6 illustrates two photoelectric wheels 2, which can electrodeposit different materials, whereby the model 4 is formed from composite materials, i.e., heterogeneous materials. A photoelectric wheel 2-1 electrodeposits a material A to form a part A 4-1 of the model 4. A photoelectric wheel 2-2 electrodeposits a material B to form a part B 4-2 of the model 4. The photoelectric wheel 2-1 and the photoelectric wheel 2-2 can simultaneously perform electrodeposition (for example, the photoelectric wheels and the platform move relatively in the horizontal direction at one time to realize electrodeposition of different materials), so as to rapidly form the model 4 having composite materials, thereby widening the application range of the electrodeposition molding device. Two photoelectric wheels 2 may be arranged on the same container 31, as shown in FIG. 5, or may be respectively arranged in different containers 31, as shown in FIG. 6. The photoelectric wheels 2 may use the same power supply 6, or, respectively use different power supplies. In addition, FIGS. 5 and 6 also show that the platform 1 is movable along the second arrow 93. The modeling mechanism is movable or vice versa.

Embodiment 4

Figure 7A:
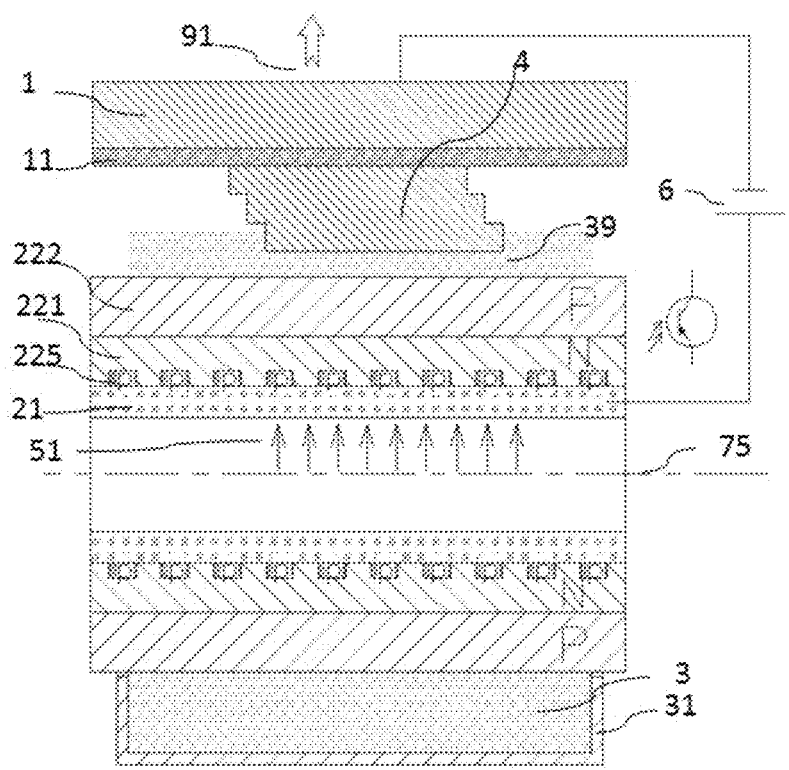
FIG. 7a is a schematic diagram of the processing device in which electrodeposition is performed according to an embodiment of the present application.

FIG. 7a is a cross-sectional view showing a photoelectric wheel 2 based on a phototransistor array (or known as "phototriode array") according to an embodiment. The photoconductive layer 22 has a PNP type phototransistor array. The photoconductive layer 22 includes a P-type semiconductor layer 222, an N-type semiconductor layer 221 attached to the P-type semiconductor layer 222, and a discrete P-type semiconductor array 225 distributed in the N-type semiconductor layer 221. The P-type semiconductor layer 222 and the ionic liquid 3 are electrically connected, for example, in a direct manner that P-type semiconductor layer 222 and the ionic liquid 3 contact each other. The P-type semiconductor layer 222 may be an array. The discrete P-type semiconductor array 225 and the transparent conductive layer 21 are in contact with each other. The N-type semiconductor layer 221 and the transparent conductive layer 21 may be insulated from each other. The transparent conductive layer 21 is electrically connected to a positive electrode of the power supply 6, and a negative electrode of the power supply 6 is electrically connected to the platform 1.

Figure 7B:
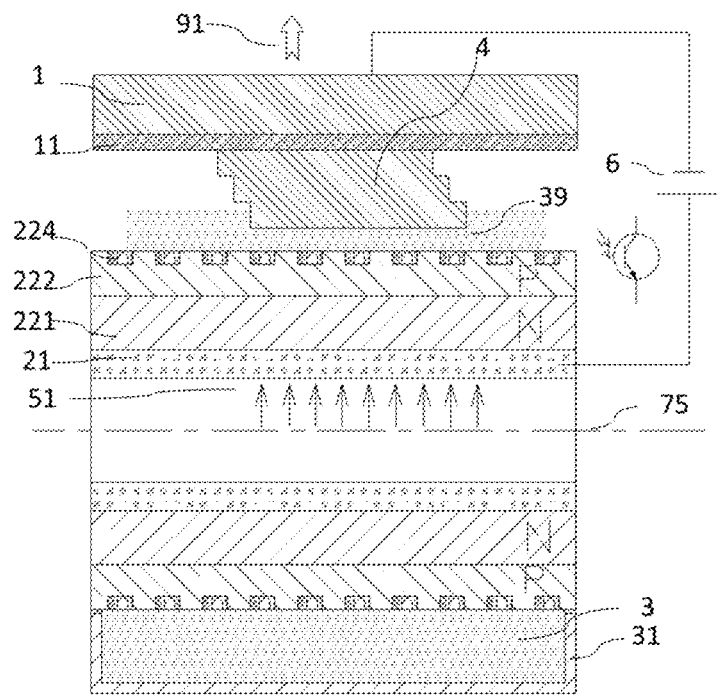
FIG. 7b is a schematic diagram of the processing device in which electrodeposition is performed according to an embodiment of the present application.

FIG. 7b illustrates that the photoconductive layer 22 has an NPN type phototransistor array. The photoconductive layer 22 includes a P-type semiconductor layer 222, an N-type semiconductor layer 221 attached to the P-type semiconductor layer 222, and a discrete N-type semiconductor array 224 distributed in the P-type semiconductor layer 222. The discrete N-type semiconductor array 224 has a discrete array or has a layered structure similar to the P-type semiconductor layer 222. The discrete N-type semiconductor array 224 is electrically connected to the ionic liquid 3, for example, in a direct manner that the discrete N-type semiconductor array 224 is in contact with the ionic liquid 3. The P-type semiconductor layer 222 may be insulated from the ionic liquid 3. The discrete N-type semiconductor array 224 and the transparent conductive layer 21 are in contact with each other. The transparent conductive layer 21 is electrically connected to a positive electrode of the power supply 6, and a negative electrode of the power supply 6 is electrically connected to the platform 1.

The photoelectric wheel 2 can be considered as a cylindrical PNP-type phototransistor array plate. When the light beam 51 selectively irradiates the photoelectric wheel 2, the photocurrent formed by the PN junction consisting of the P-type semiconductor layer 222 and the N-type semiconductor layer 221 is amplified by the phototransistor due to the photovoltaic effect. Compared to the photoelectric wheel 2 having the structure of the PN junction mentioned above, current can be increased under the same illumination, which can improve the sensitivity of controlling current by illumination and the electrodeposition speed, thereby facilitating the control to the magnitude of current during the electrodeposition and the electrodeposition speed by adjusting illumination intensity. FIG. 7a or 7b also shows a detachable plate 11 arranged the platform 1. The detachable plate 11 is conductive and from which the model 4 can be easily removed.

In the aforementioned embodiments, after the modeling mechanism moves a certain distance along the second arrow 93, it moves in an opposite direction for electrodepositing the next layer, in other words, the modeling mechanism can perform horizontal reciprocation for layer-by-layer electrodeposition. Of course, the layer-by-layer electrodeposition molding can also be realized by horizontal reciprocation of the platform 1.

Embodiment 5

FIG. 8 illustrates that the platform 1 is rotatable around an axis 76 along the second arrow 93, or the modeling mechanism is rotatable around the axis 76 along the second arrow 93 in an opposite direction, so that the platform 1 and the modeling mechanism (or the photoelectric wheel 2) are movable with respect to each other around the axis 76 in the horizontal direction. The photoelectric wheel 2 rotates around an axis 75 along the first arrow 92 such that the ionic liquid 3 arrives between the photoelectric wheel 2 and the platform 1 to perform selective electrodeposition. The photoelectric wheel 2 preferably has a shape of a hollow truncated cone, which can improve the consistency of the replacement rate of the ionic liquid layer 39 between the photoelectric wheel 2 and the platform 1. When it is required to electrodeposit a layered model, the platform 1 moves layer by layer or continuously move along the third arrow 91. Such structure can avoid the relative movement between the modeling mechanism and the platform during the horizontal reciprocation, thereby improving the efficiency and reducing the vibration.

Embodiment 6

FIG. 9 illustrates a plurality of modeling mechanisms rotatable around an axis 76, which can simultaneously perform modeling to increase the modeling speed and to achieve electrodeposition of composite materials. With such structure, multiple layers can be simultaneously electrodeposited, as the device shown in FIG. 5 does, and the electrodeposition of various materials can be realized, as the device shown in FIG. 6 does. During the electrodeposition using the device shown in FIGS. 8 and 9, the platform 1 continuously moves along the third arrow 91, such that a spiral movement is formed during the electrodepositing process, so as to avoid the reciprocating movement of the modeling mechanism or the platform 1, whereby the photoelectric wheel 2 can continuously and stably rotate, and the platform 1 also can continuously and stably rotate as well as move along the third arrow 91, thereby improving the stability, speed and accuracy of the electrodeposition molding. The selective electrical etching can be realized by swapping positions of two electrodes of the power supply 6.

Embodiment 7

Figure 10:
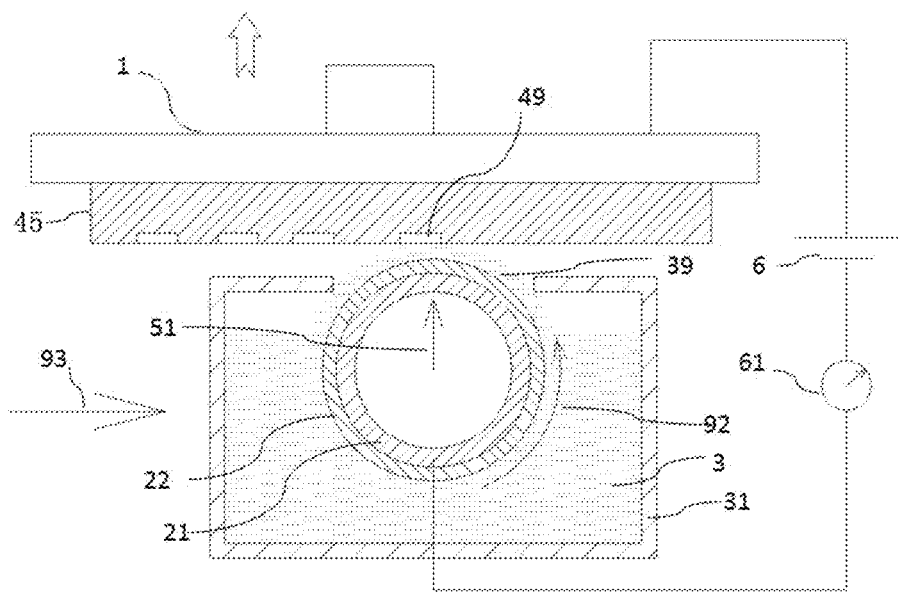
FIG. 10 is a schematic diagram of the processing device in which electroetching is performed according to an embodiment of the present application.

As shown in FIG. 10, an electroetching processing device based on electrochemistry is used for selective electroetching. An etching groove 49 is formed on the platform 1, as shown in FIG. 12*a*, and an etching groove 49 is formed on a substrate 45 which is conductive and fixed on the platform 1, as shown in FIGS. 10-11 and 15-16. In the latter case, the substrate 45 can be regarded as the platform 1 or a part thereof.

The electroetching processing device differs from the electrodeposition processing device in that the positive electrode of the power supply 6 is electrically connected to the platform 1, and the negative electrode of the power supply 6 is electrically connected to the transparent conductive layer 21. According to groove patterns, a light beam 51 passes through the transparent conductive layer 21 toward the platform 1 to selectively irradiate the photoconductive layer 22, so as to form an electrode array or an electrode pattern. A localized electric field is formed between the photoelectric wheel 2 and the platform 1. As the photoelectric wheel 2 and the platform 1 move relatively along the second arrow 93, an etching groove 49 is formed on the platform 1 or on the substrate 45. The photoelectric wheel 2 rotates along the first arrow 92 to take away the ionic liquid layer 39 with a high ionic concentration and replenish an ionic liquid with a low ionic concentration, thereby ensuring the continuous electrochemical etching.

Embodiment 8

Figure 11:
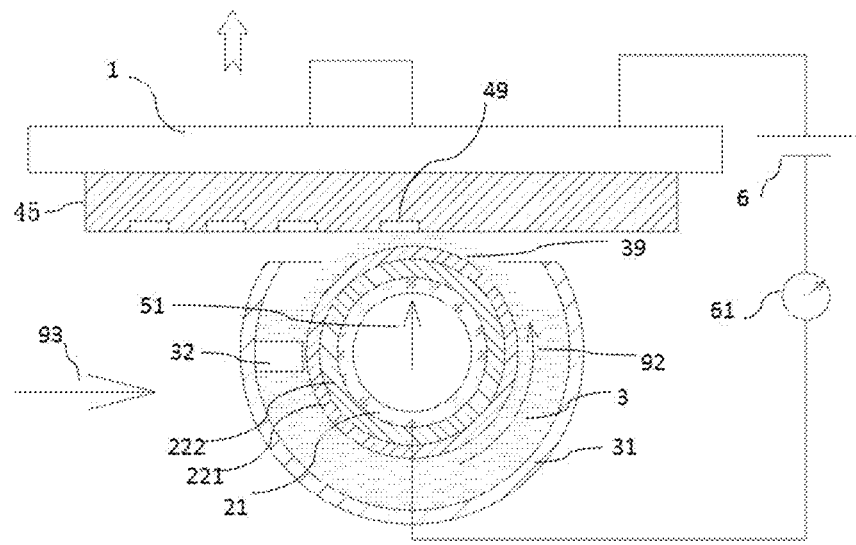
FIG. 11 is a schematic diagram of the processing device in which electroetching is performed according to an embodiment of the present application.
Figure 12A:
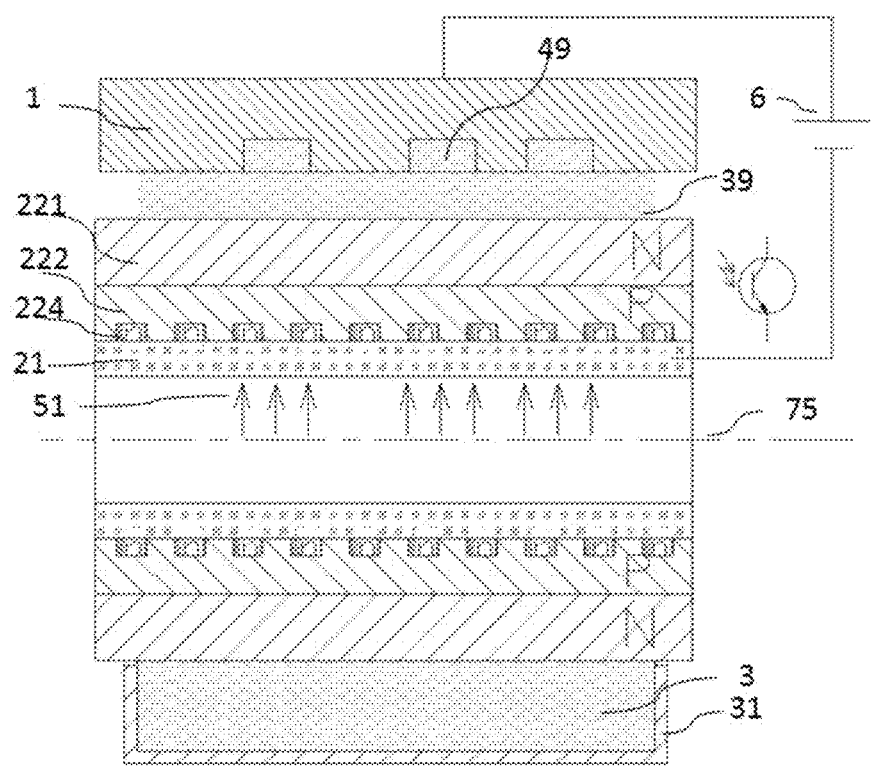
FIG. 12a is a schematic diagram of the processing device in which electroetching is performed according to an embodiment of the present application.

FIG. 11 illustrates a photoconductive layer 22 having a PN junction, which includes an N-type semiconductor layer 221 and a P-type semiconductor layer 222 bound together. The N-type semiconductor layer 221 and the ionic liquid 3 are electrically connected in a direct manner that the N-type semiconductor layer 221 and the ionic liquid are in contact with each other, or in an indirect manner, i.e., a conductive protective layer is provided on a surface of the N-type semiconductor layer 221 to contact the ionic liquid 3. The conductive protective layer is preferably arranged in a discrete array to prevent current diffusion therein and ensure the electrochemical machining accuracy. The container 31 may also be provided with a scraper 32. The scraper 32 and the photoelectric wheel 2 are in slight clearance fit or in sliding fit.

A cavity of the container is divided, by the scraper, into a first region and a second region. An ionic liquid with a high ionic concentration is arranged in the second region arranged above the scraper 32 or a left side of the scraper 32, as shown in FIG. 11. An ionic liquid with a low ionic concentration is arranged in the first region arranged below the scraper 32 or a right side of the scraper 32, as shown in FIG. 11. The position of the ionic liquid with the low ionic concentration and the position of the ionic liquid with the high ionic concentration may swap if the photoelectric wheel 2 rotates in the opposite direction of the first arrow 92. During the electrochemistry, the ionic liquid with the high ionic concentration is separated from the ionic liquid with the low ionic concentration. The ionic liquid with the high ionic concentration can be introduced into an ion dilution device (not shown in the figures) via an ion liquid return line, and then flows into the first region via an ionic liquid supply line from the ion dilution device. Such arrangement is conducive to uniform ion distribution and preferred ion concentration during the formation of the ionic liquid layer 39 under the rotation of the photoelectric wheel 2.

Embodiment 9

FIG. 12*a* illustrates a photoelectric wheel 2 based on a phototransistor array structure. The photoconductive layer 22 has an NPN-type phototransistor array. The photoelectric wheel 2 can be considered as a cylindrical NPN-type phototransistor array plate, including an N-type semiconductor layer 221, a P-type semiconductor layer 222 bound together, and a discrete N-type semiconductor array 224 distributed in the P-type semiconductor layer 222. The N-type semiconductor layer 221 is electrically connected to the ionic liquid 3, for example, in a direct manner that The N-type semiconductor layer 221 is in contact with the ionic liquid 3. The discrete N-type semiconductor array 224 is in contact with the transparent conductive layer 21, and the P-type semiconductor layer 222 and the transparent conductive layer 21 may be electrically insulated from each other. The discrete N-type semiconductor array 224 is electrically connected to the negative electrode of the power supply 6, and the positive electrode of the power supply 6 is electrically connected to the platform 1.

Figure 12B:
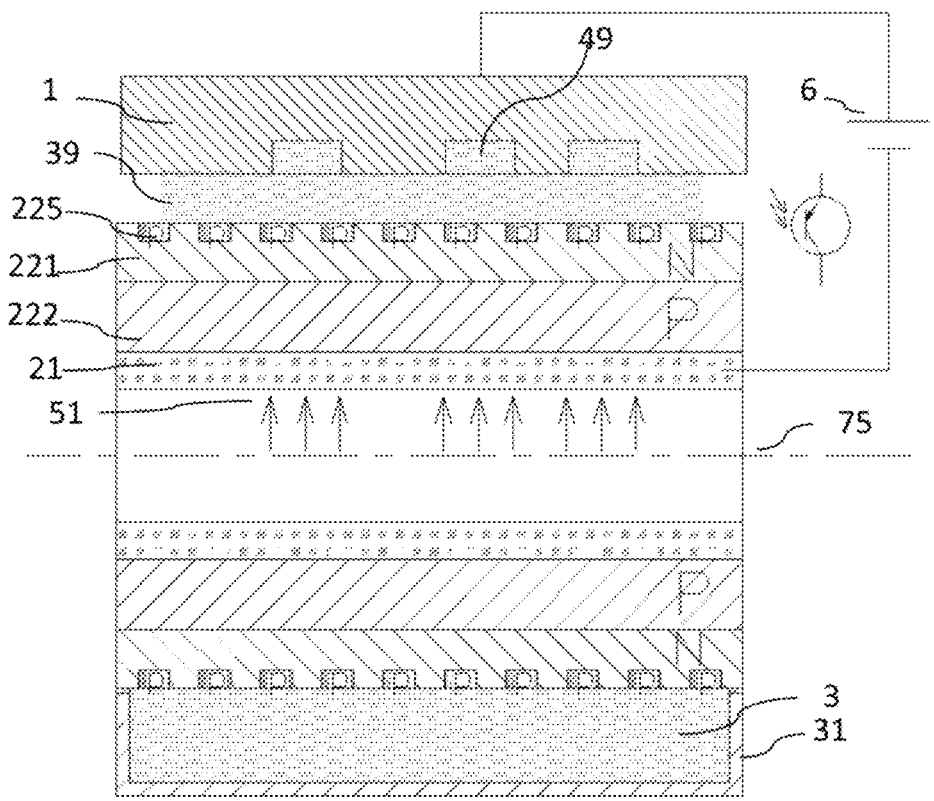
FIG. 12b is a schematic diagram of the processing device in which electroetching is performed according to an embodiment of the present application.

FIG. 12*b* illustrates a photoconductive layer 22 having a PNP-type phototransistor array, which includes an N-type semiconductor layer 221, a P-type semiconductor layer 222 bound together, and a discrete P-type semiconductor array 225 distributed in the N-type semiconductor layer 221. The discrete P-type semiconductor array 225 may be discrete, as shown in the figures, or may be of a layer structure. The discrete P-type semiconductor array 225 is electrically connected to the ionic liquid 3, for example, in a direct manner that the discrete P-type semiconductor array 225 is in contact with the ionic liquid 3. The N-type semiconductor layer 221 and the ionic liquid 3 may be electrically insulated from each other, and the P-type semiconductor layer 222 and the transparent conductive layer 21 are in contact with each other. The P-type semiconductor layer 222 is electrically connected to the negative electrode of the power supply 6, and the positive electrode of the power supply 6 is electrically connected to the platform 1.

When the light beam 51 selectively irradiates the photoelectric wheel 2, the photocurrent formed by the PN junction consisting of the N-type semiconductor layer 221 and the P-type semiconductor layer 222 is amplified by the phototransistor due to the photovoltaic effect. Compared to the photoelectric wheel 2 having the structure of the PN junction described above, current is increased under the same illumination, which can improve the sensitivity of controlling current by illumination and the electrochemical etching speed. In an embodiment as shown by FIG. 11, FIG. 12*a* or FIG. 12*b*, the power supply 6 can be removed, and be replaced with a wire. The irradiated area generates electricity and electrical field between the photoelectric wheel 2 and the platform 1 due to photovoltaic effect, so the electrodeposition can be performed without the power supply. Therefore, localized electrodeposition can be carried out in the area where photovoltaic power generates by the control of the light beam 51. The device structure and processing can be simplified, and it is conductive to application and cost.

Embodiment 10

FIGS. 13-16 illustrate that a container 31 is arranged beside the photoelectric wheel 2. In the exemplary embodiments as shown in the figures, the container 31 is arranged on a side of photoelectric wheel 2 and configured to store the ionic liquid 3 for use. Specifically, as the photoelectric wheel 2 rotates in the direction of the first arrow 92, the ionic liquid 3 is continuously attached to the outer surface of photoelectric wheel 2 from the container 31, and transferred to a region between the photoelectric wheel 2 and the platform 1. The ionic liquid 3 may spread toward the photoelectric wheel 2 from the container 31 to form an ionic liquid layer on the outer surface of the photoelectric wheel 2. The modeling mechanism includes the photoelectric wheel 2 and the container 31, and the relative position of the photoelectric wheel 2 and the container 31 may be fixed. The container 31 may include an enclosure for storing the ionic liquid 3, and may also include devices such as a brush and rollers, which are configured to transfer the ionic liquid 3 to the outer surface of the modeling mechanism 2. The photoelectric wheel 2 is not partially immersed in the ionic liquid 3 in the container 31, whereby the processing can proceed even there is a small amount of the ionic liquid, which further helps to reduce the production costs, the equipment size and the leakage of the ionic liquid 3, thereby allowing the device to operate under a favored environment, further facilitating the simultaneous operation of multiple modeling mechanisms for electrodeposition and realizing electrodeposition of the heterogeneous material.

Provided herein is a processing method based on electrochemistry using the processing device mentioned above. The processing method includes the follow steps.

1) The photoelectric wheel 2 starts to continuously rotate in one direction or to rotate in a reciprocating manner; and an ionic liquid layer 39 is attached on the outer surface of the photoelectric wheel 2.

2) A distance between the platform 1 and the photoelectric wheel 2 is adjusted to a preset value, so that the platform 1 is in contact with the ionic liquid layer 39 and is not in contact with the photoelectric wheel 2.

3) According to a structure of a model to be deposited or etched, the light beam 5 emitted by the light source is controlled to pass through the transparent conductive layer 21 to selectively irradiate the photoconductive layer 22, so that a preset electrode pattern is formed on the photoelectric wheel 2, and a localized electric field is formed in the ionic liquid layer between the photoelectric wheel 2 and the platform 1.

4) When the transparent conductive layer 21 is electrically connected to a positive electrode of the power supply 6, and the platform 1 is electrically connected to a negative electrode of the power supply 6, electrodeposition proceeds at a part of the platform 1 corresponding to the localized electric field. When the transparent conductive layer 1 is electrically connected to the negative electrode of the power supply 6, and the platform 1 is electrically connected to the positive electrode of the power supply 6, electroetching proceeds on a part of the platform 1 corresponding to the localized electric field.

5) The platform and the photoelectric wheel are controlled to move relatively in a horizontal direction, and the light beam 51 emitted by the light source 5 selectively irradiates the photoelectric wheel 2 to perform electrodeposition on the platform 1 to obtain a model 4 with a preset shape or perform electrolysis on the platform 1 to obtain an etching groove 49 with a preset shape.

The model is built in a layer-by-layer manner during electrodeposition, if the model to be prepared is thick or there are other needs. Steps 2)-5) are repeated to deposit respective layers of the model in sequence, so as to obtain the model 4. When a layer of the model 4 is formed on the platform 1, in step 2), a distance between the model 4 and the photoelectric wheel 2 is adjusted to a preset value, so that the model 4 is in contact with the ionic liquid layer 39 and does not contact the photoelectric wheel 2.

During the electrodeposition of a multi-layered model, the model with several layers deposited thereon may has an uneven surface, i.e. it has the poor surface flatness. The surface flatness can be optimized through the method as follows.

Firstly, respective layers of the model are detected to obtain their surface flatness, i.e., their convex-concave distribution state, by a detection device 89, for example, a camera, as shown in FIG. 3. The detection device 89 is movable along the second arrow 93 or in an axis direction of the photoelectric wheel 2. In an embodiment, the detection device 89 is arranged on the modeling mechanism to detect the surface flatness of the respective layers of the model 4.

Subsequently, according to the obtained surface flatness, the current is increased or decreased in step 3) at different parts of the corresponding layer during the electrodeposition, so that the respective layers of the model are flatter. For example, the current is relatively increased for concave parts and decreased for convex parts. By such way, the molding accuracy of the model 4 is improved. The current can be adjusted by changing the irradiation intensity of the light beam 51 at different parts of the corresponding layer according to the surface flatness of the respective layers of the model 4. For example, the light intensity is increased for the concave parts of the corresponding layer, and thus the current is increased. The light intensity is decreased for the convex parts of the corresponding layer, and thus the current is decreased, whereby the electrodeposition speed is increased at the concave parts and reduced at the convex parts in step 4), so the respective layers of the model 4 are automatically adjusted to have a flat surface, thereby improving the printing accuracy of the electrodeposition. In the case of electroetching, the etching groove 49 is detected to obtain a depth pattern thereof, and then the current magnitude corresponding to respective points is controlled to level the etching groove 49.

The terms "upper", "lower", "left" and "right" and the like are used herein for the purpose of the description, but are not intended to limit the present application, In practice, some modifications can be made by those skilled in the art by the spatial transformation and actual orientation change of the structure. However, these modifications should fall within the scope of the present application.

What is claimed is:

1. A processing device based on electrochemistry, comprising:
   a platform which is electrically conductive;
   a power supply;
   a light source;
   a container configured to store an ionic liquid; and
   at least one modeling mechanism;

wherein the at least one modeling mechanism is arranged facing the platform; and the at least one modeling mechanism and the platform are movable with respect to each other;

the at least one modeling mechanism comprises a photoelectric wheel which is rotatable; and an outer surface of the photoelectric wheel is able to be applied with the ionic liquid from the container;

wherein the photoelectric wheel comprises a transparent conductive layer and a photoconductive layer bound together from inside to outside; the transparent conductive layer is electrically connected to an electrode of the power supply; and the platform is electrically connected to the other electrode of the power supply; and a light beam emitted by the light source passes through the transparent conductive layer towards the platform to selectively irradiate the photoconductive layer.

2. The processing device of claim 1, wherein the photoconductive layer is formed from a photoconductive material.

3. The processing device of claim 1, wherein the photoconductive layer has a PN junction consisting of an N-type semiconductor layer and a P-type semiconductor layer bound together;

in the case of electrodeposition, the P-type semiconductor layer is arranged on an outer side of the N-type semiconductor layer; and in the case of electroetching, the N-type semiconductor layer is arranged on an outer side of the P-type semiconductor layer.

4. The processing device of claim 1, wherein the photoconductive layer has a PNP-type phototransistor array;

in the case of electrodeposition, the photoconductive layer comprises an N-type semiconductor layer and a P-type semiconductor layer bound together from inside to outside; the N-type semiconductor layer is provided with a discrete P-type semiconductor array which is electrically connected to the transparent conductive layer; and the transparent conductive layer is electrically connected to a positive electrode of the power supply; and in the case of electroetching, the photoconductive layer comprises the N-type semiconductor layer and the P-type semiconductor layer bound together from outside to inside; the N-type semiconductor layer is provided with the discrete P-type semiconductor array; the P-type semiconductor layer is electrically connected to the transparent conductive layer; and the transparent conductive layer is electrically connected to a negative electrode of the power supply.

5. The processing device of claim 1, wherein the photoconductive layer has an NPN-type phototransistor array;

in the case of electrodeposition, the photoconductive layer comprises an N-type semiconductor layer and a P-type semiconductor layer bound together from inside to outside; the P-type semiconductor layer is provided with a discrete N-type semiconductor array; the N-type semiconductor layer is electrically connected to the transparent conductive layer; and the transparent conductive layer is electrically connected to a positive electrode of the power supply; and in the case of electroetching, the photoconductive layer comprises the P-type semiconductor layer and the N-type semiconductor layer bound together from inside to outside; the P-type semiconductor layer is provided with the discrete N-type semiconductor array which is electrically connected to the transparent conductive layer; and the transparent conductive layer is electrically connected to a negative electrode of the power supply.

6. The processing device of claim 1, wherein in the case of electrodeposition, the transparent conductive layer is electrically connected to a positive electrode of the power supply; the platform is electrically connected to a negative electrode of the power supply; and in the case of electroetching, the transparent conductive layer is electrically connected to the negative electrode of the power supply; and the platform is electrically connected to the positive electrode of the power supply.

7. The processing device of claim 1, wherein the modeling mechanism and the platform are movable with respect to each other in a horizontal direction;

wherein the modeling mechanism and the platform perform linear translation with respect to each other in the horizontal direction, or the modeling mechanism and the platform are rotatable with respect to each other in the horizontal direction around an axis.

8. The processing device of claim 6, wherein the modeling mechanism and the platform are movable with respect to each other in a vertical direction.

9. The processing device of claim 1, the at least one modeling mechanism is arranged under the platform, and the at least one modeling mechanism further comprises the container in which the ionic liquid is stored; and the photoelectric wheel is rotatably arranged in the container and partially immersed in the ionic liquid.

10. The processing device of claim 1, wherein the photoelectric wheel is of a hollow cylindrical structure, and the photoelectric wheel and the platform perform linear translation with respect to each other.

11. The processing device of claim 1, wherein the photoelectric wheel is of a conveyor belt structure and is supported by at least two rollers.

12. The processing device of claim 1, wherein the photoelectric wheel is a hollow truncated cone; and the platform and the photoelectric wheel are rotatable with respect to each other around an axis.

13. The processing device of claim 1, wherein a detachable plate is electrically conductive and provided on a side of the platform facing the photoelectric wheel.

14. The processing device of claim 9, wherein a scraper is provided in the container and submerged in the ionic liquid; the scraper and the outer surface of the photoelectric wheel are in sliding fit or in clearance fit;

a cavity of the container is divided by the scraper into a first region and a second region; an ionic liquid with a low ionic concentration is arranged in the first region; an ionic liquid with a high ionic concentration is arranged in the second region; in the case of electrodeposition, the first region is connected to an ion replenisher via an ion liquid return line, and the second region is connected to the ion replenisher via an ionic liquid supply line; and in the case of electroetching, the second region is connected to an ion dilution device via the ion liquid return line, and the first region is connected to the ion dilution device via the ionic liquid supply line.

15. A processing device based on electrochemistry, comprising:

a platform which is electrically conductive;
a light source;
a container configured to store an ionic liquid; and
at least one modeling mechanism;

wherein the at least one modeling mechanism is arranged facing the platform; and the at least one modeling mechanism and the platform are movable with respect to each other;

the at least one modeling mechanism comprises a photoelectric wheel which is rotatable; an outer surface of the photoelectric wheel is able to be applied with the ionic liquid from the container;

wherein the photoelectric wheel comprises a transparent conductive layer and a photoconductive layer bound together from inside to outside; the transparent conductive layer is electrically connected to the platform; the photoconductive layer comprises a P-type semiconductor layer and an N-type semiconductor layer; when the P-type semiconductor layer and the ionic liquid are electrically connected, the N-type semiconductor layer is electrically connected to the transparent conductive layer; and when the N-type semiconductor layer and the ionic liquid are electrically connected, the P-type semiconductor layer is electrically connected to the transparent conductive layer; and a light beam emitted by the light source passes through the transparent conductive layer towards the platform to selectively irradiate the photoconductive layer.

16. A processing method based on electrochemistry using the processing device of claim 1, the processing method comprising:

1) activating the photoelectric wheel to rotate; and forming an ionic liquid layer attached on the outer surface of the photoelectric wheel;

2) adjusting a distance between the platform and the photoelectric wheel to a preset value, so that the platform is in contact with the ionic liquid layer;

3) according to a structure of a model to be deposited or etched, controlling the light beam emitted by the light source to pass through the transparent conductive layer to selectively irradiate the photoconductive layer; forming a preset electrode pattern on the photoelectric wheel; and forming a localized electric field in the ionic liquid layer between the photoelectric wheel and the platform;

4) when the transparent conductive layer is electrically connected to a positive electrode of the power supply, and the platform is electrically connected to a negative electrode of the power supply, performing electrodeposition on a position of the platform corresponding to the localized electric field; when the transparent conductive layer is electrically connected to the negative electrode of the power supply, and the platform is electrically connected to the positive electrode of the power supply, performing etching on a position of the platform corresponding to the localized electric field; and 5) controlling the platform and the photoelectric wheel to move relatively in a horizontal direction; and forming, by electrodeposition, a model with a preset shape on the platform, or forming, by electrolysis, an etching groove with a preset shape on the platform.

17. The processing method of claim 16, wherein the model is built in a layer-by-layer manner during electrodeposition; steps 2)-5) are repeated to deposit respective layers of the model to be deposited in sequence, so as to obtain the model; when a layer of the model is formed on the platform, in step 2), a distance between the model and the photoelectric wheel is adjusted to a preset value, so that the model is in contact with the ionic liquid layer, and is separated from the photoelectric wheel.

18. The processing method of claim 16, wherein during electrodeposition or electroetching, respective layers of the model are detected to obtain their surface flatness or the etching groove is detected to obtain a depth pattern of the etching groove, and current is increased or decreased at respective points of the respective layers of the model to flatten the respective layers of the model or level the etching groove.

19. The processing method of claim 16, wherein in step 3), a light intensity of the light beam of respective points of respective layers of the model is adjusted so as to increase or decrease their current.

20. The processing method of claim 16, wherein a plurality of modeling mechanisms are provided to electrodeposit heterogeneous materials.

* * * * *